(12) United States Patent
Izumi et al.

(10) Patent No.: US 7,652,510 B2
(45) Date of Patent: Jan. 26, 2010

(54) SEMICONDUCTOR DEVICE HAVING DRIVER WITH TEMPERATURE DETECTION

(75) Inventors: Masato Izumi, Fuchu (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/131,521

(22) Filed: Jun. 2, 2008

(65) Prior Publication Data
US 2008/0303581 A1 Dec. 11, 2008

(30) Foreign Application Priority Data
Jun. 7, 2007 (JP) ............................. 2007-151836

(51) Int. Cl.
*H03K 3/00* (2006.01)
(52) U.S. Cl. ..................... 327/108; 327/112; 327/434
(58) Field of Classification Search .............. 327/108, 327/434
See application file for complete search history.

(56) References Cited

U.S. PATENT DOCUMENTS

| | | | |
|---|---|---|---|
| 4,689,495 A * | 8/1987 | Liu | ............................. 327/108 |
| 6,046,470 A | 4/2000 | Williams et al. | |
| 6,144,085 A | 11/2000 | Barker | |
| 6,149,299 A | 11/2000 | Aslan et al. | |
| 6,486,523 B2 | 11/2002 | Tomomatsu | |
| 6,975,146 B1 * | 12/2005 | Schottler | .................... 327/108 |
| 7,463,071 B2 * | 12/2008 | Ribarich | ..................... 327/110 |
| 2004/0124889 A1 * | 7/2004 | Koharagi et al. | ............ 327/108 |

FOREIGN PATENT DOCUMENTS

| | | |
|---|---|---|
| JP | 63-182550 | 11/1988 |
| JP | 05-235348 | 9/1993 |
| JP | 2002-280556 | 9/2002 |
| JP | 2002-289789 | 10/2002 |
| JP | 2006-237331 | 9/2006 |

* cited by examiner

*Primary Examiner*—Lincoln Donovan
*Assistant Examiner*—Ryan C Jager
(74) *Attorney, Agent, or Firm*—Oblon, Spivak, McClelland, Maier & Neustadt, L.L.P.

(57) ABSTRACT

A semiconductor device comprises a driver provided for a semiconductor element having a control electrode to which a drive voltage is applied, the semiconductor element being switched between the conduction state and the non-conduction state based on the drive voltage, the driver operative to apply the drive voltage to the control electrode; a detector operative to supply a voltage detection signal oscillating at a certain frequency to the control electrode to detect a first voltage having a certain relation to a voltage applied to the semiconductor element; and a controller operative to control the detector based on the first voltage detected at the detector.

15 Claims, 2 Drawing Sheets

SEMICONDUCTOR DEVICE HAVING DRIVER WITH TEMPERATURE DETECTION

CROSS-REFERENCE TO RELATED APPLICATION

This application is based upon and claims the benefit of priority from the prior Japanese Patent Application No. 2007-151836, filed on Jun. 7, 2007, the entire contents of which are incorporated herein by reference.

BACKGROUND OF THE INVENTION

1. Field of the Invention

The present invention relates to a semiconductor device capable of measuring the temperature of a semiconductor element.

2. Description of the Related Art

A semiconductor device may suffer a high temperature depending on the electric-power to be dealt with therein. Accordingly, in recent years, a temperature sensor is attached to detect the temperature of the semiconductor device and control operation of the semiconductor device, thereby suppressing heat produced at the semiconductor device, as has been known (for example, see JP 2002-280556A).

Such the temperature sensor for the semiconductor device includes a temperature detector (such as a diode formed of polysilicon) formed on a portion in the surface of a heat-producing chip (semiconductor element). It also includes a temperature measuring circuit provided outside the chip to measure a temperature based on a signal from the temperature detector. The formation of the temperature detector in the chip surface, however, results in an increase in complexity of process steps and an increase in area occupied by the semiconductor element due to ensuring the space for that formation, which exert a harmful influence on fine pattering. Further, the complexity of process steps increases the production cost of the semiconductor device.

SUMMARY OF THE INVENTION

In accordance with one aspect of the invention, a semiconductor device comprises a driver provided for a semiconductor element having a control electrode to which a drive voltage is applied, the semiconductor element being switched between the conduction state and the non-conduction state based on the drive voltage, the driver operative to apply the drive voltage to the control electrode; a detector operative to supply a voltage detection signal oscillating at a certain frequency to the control electrode to detect a first voltage having a certain relation to a voltage applied to the semiconductor element; and a controller operative to control the detector based on the first voltage detected at the detector.

DETAILED DESCRIPTION OF THE EMBODIMENTS

One embodiment of the present invention will now be described with reference to the drawings.

Figure 1:
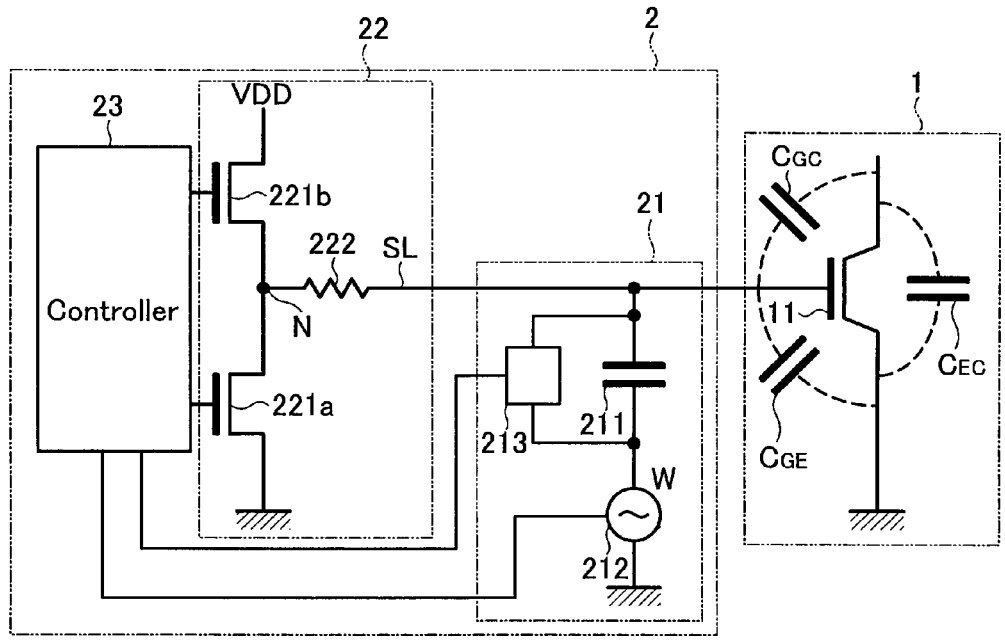
FIG. 1 is a circuit diagram showing a semiconductor device according to one embodiment of the present invention.

FIG. 1 is a block diagram of a semiconductor device according to one embodiment of the present invention. As shown in FIG. 1, the semiconductor device according to one embodiment comprises a semiconductor element section 1 including a semiconductor element, which produces heat on the application of voltage, such as an IGBT (power semiconductor device (Device Under Test (DUT)) 11. It also comprises a driver/temperature detector 2, which drives the semiconductor element section 1 and detects the temperature thereof. The driver/temperature detector 2 applies a drive voltage via a signal line SL to the IGBT 11 in the semiconductor element section 1 and detects the temperature of the semiconductor element section 1 based on a signal from the signal line SL. The driver/temperature detector 2 is not necessarily formed on the chip of the semiconductor element section 1 but may be arranged at any position connectable to the signal line SL in the same chip as that of the semiconductor element section 1. Alternatively, it may be arranged on a separate chip from that of the semiconductor element section 1.

The IGBT 11 has a gate connected to the signal line SL and one end (emitter) grounded. The other end (collector) is connected to an external circuit. The IGBT 11 has a parasitic capacity $C_{GC}$ between the gate and the collector, a parasitic capacity $C_{EC}$ between the collector and the emitter, and a parasitic capacity $C_{GE}$ between the gate and the emitter.

The driver/temperature detector 2 includes a detector 21, a driver 22, and a controller 23. The detector 21 oscillates a voltage detection signal W applied to the gate of the IGBT 11. The detector 21 detects a first voltage having a certain relation with a voltage applied to the IGBT 11. The details of the voltage detection signal W are described later. The driver 22 has a function of applying the drive voltage to the gate of the IGBT 11 via the signal line SL such that the IGBT 11 is switched between the conduction state and the non-conduction state. The controller 23 controls the driver 22 and the detector 21 and derives the temperature of the IGBT 11 from the capacitance of the IGBT 11 based on the first voltage detected at the detector 21.

The detector 21 includes a capacitor 211 having one end connected to the signal line SL, an oscillator 212 having one end connected to the other end of the capacitor 211, and the other end grounded, and a voltmeter 213 connected across the capacitor 211. The oscillator 212 and the voltmeter 213 are connected to the controller 23.

It is assumed that an Alternate Current (AC) voltage applied to the signal line SL has a frequency of 1 kHz and the frequency of 1 kHz is used as the switching frequency to on/off-control the IGBT 11 as its gate. In this case, the oscillator 212 oscillates an AC voltage as the voltage detection signal W. The AC voltage may have a frequency of 1 MHz, which is at least higher than the switching frequency such that the temperature of the IGBT 11 can be detected within either in a conduction state or non-conduction state of the IGBT 11. In response to the voltage detection signal W, a bipolar transistor inside the IGBT 11 operates such that an amplified AC current flows in the IGBT 11 through the capacitor 211. The voltage detection signal W, the capacitance of the capacitor 211, and the capacitance of the IGBT 11 determine the voltage applied between the both ends of the capacitor 211. The voltmeter 213 measures the voltage and provides it to the controller 23. The voltage measured at the voltmeter 213 is the first voltage having a certain relation with the voltage applied to the IGBT 11. The voltage has a certain relation with the current flowing in the IGBT 11 in response to the amplification effect.

The driver 22 includes two transistors 221a, 221b, and a resistor 222. The transistor 221a is serially connected to the transistor 221b at a node N. The other end of the transistor 221a is grounded while the other end of the transistor 221b is supplied with a voltage sufficient to turn on the gate of the IGBT 11. The transistors 221a, 221b have respective gates, which are supplied with the control voltage from the controller 23. One end of the resistor 222 is connected to the node N and the other end of the resistor 222 is connected to the signal line SL.

The controller 23 on/off-controls the gates of the transistors 221a, 221b to vary the drive voltage applied to the gate of the IGBT 11. The controller 23 controls operation of the oscillator 212 to vary the voltage detection signal W and measures (determines) the temperature of the IGBT 11 based on the first voltage measured at the voltmeter 213.

Figure 2A:
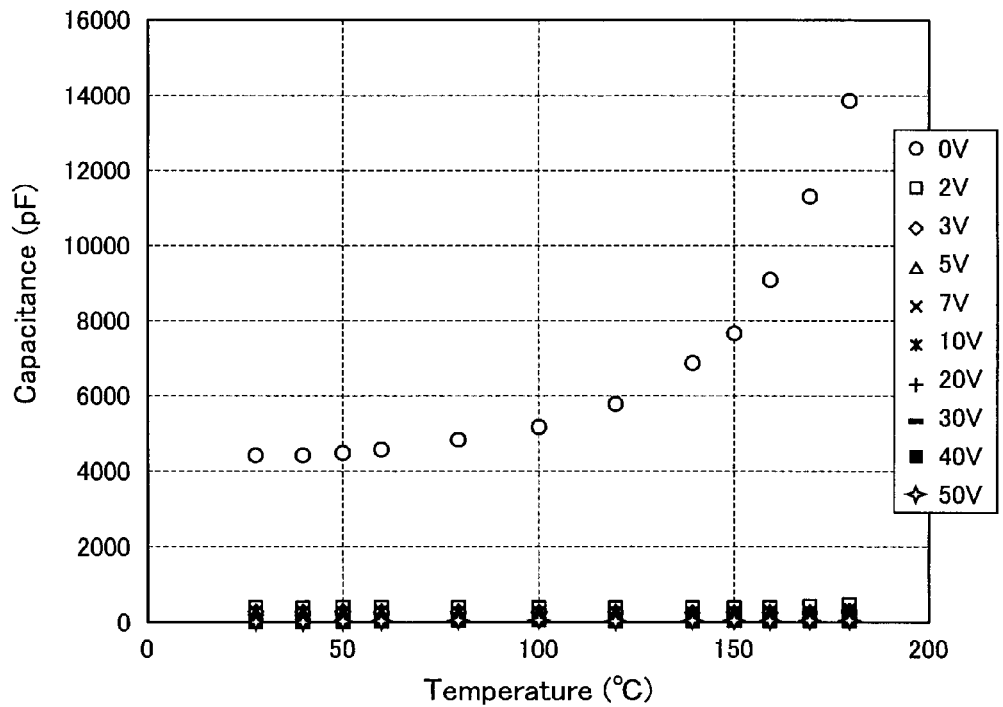
FIG. 2A shows relations between the capacitance of an IGBT 11 and the temperature of the IGBT 11 in the semiconductor device according to one embodiment of the present invention.
Figure 2B:
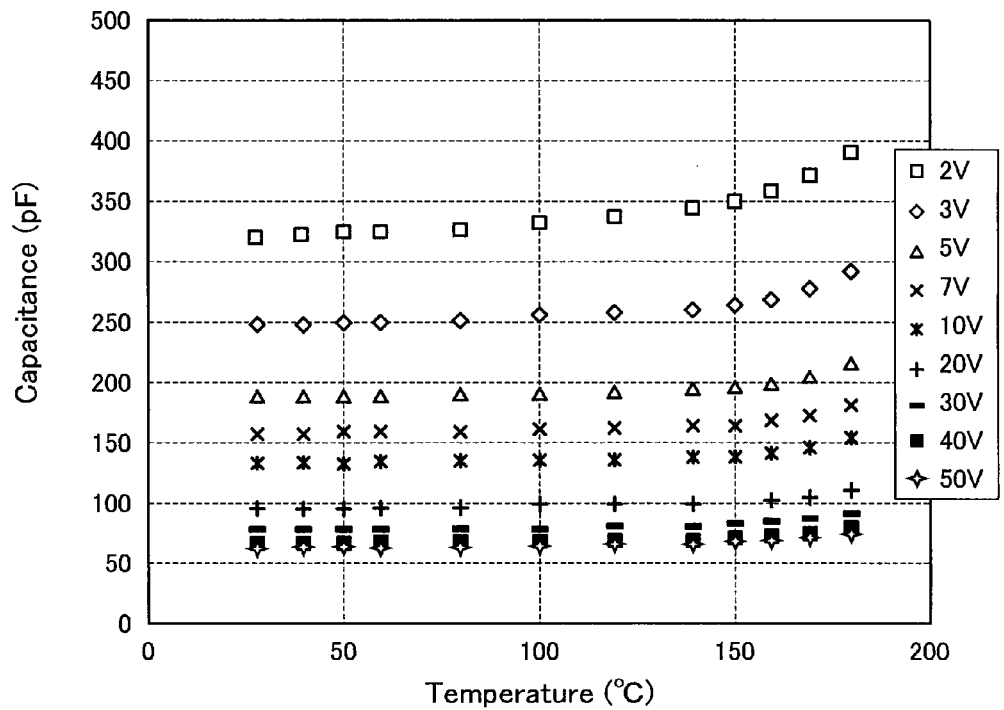
FIG. 2B shows relations between the capacitance of the IGBT 11 and the temperature of the IGBT 11 in the semiconductor device according to one embodiment of the present invention.

With reference to FIGS. 2A and 2B, the following description is given to relations among the gate voltage (0 V, 2 V, 3 V, 5 V, 7 V, 10 V, 20 V, 30 V, 40 V, and 50 V), the capacitance (pF) of the IGBT 11 estimated from the voltage across the capacitor 211, and the temperature (° C.) of the IGBT 11. In FIGS. 2A and 2B, the axis of ordinate indicates the capacitance (pF) of the IGBT 11 estimated from the voltage measured at the voltmeter 213 while the axis of abscissa indicates the temperature (° C.) of the IGBT 11. FIG. 2A shows the axis of ordinate within 0-16000 pF and FIG. 2B shows the axis of ordinate within 0-500 pF. The graphics (such as a white circle, a white diamond, and a white triangle) of the measurement points vary among the gate voltages applied to the gate of the IGBT 11 at the time of measurements.

As can be found from FIGS. 2A and 2B, the capacitance (pF) of the IGBT 11 increases as the temperature of the gate of the IGBT 11 rises. In particular, when the gate voltage is kept at 0 V, it varies extremely. Therefore, if the gate voltage applied to the IGBT 11 and the capacitance of the IGBT 11 can be determined, these values can be used to derive the temperature of the IGBT 11 therefrom. The controller 23 has a table showing relations between the capacitance and the temperature of the IGBT 11 at the drive voltage on the application of the voltage detection signal W as shown in FIGS. 2A and 2B. Based on the table, it calculates (determines) the temperature of the IGBT 11.

Figure 3:
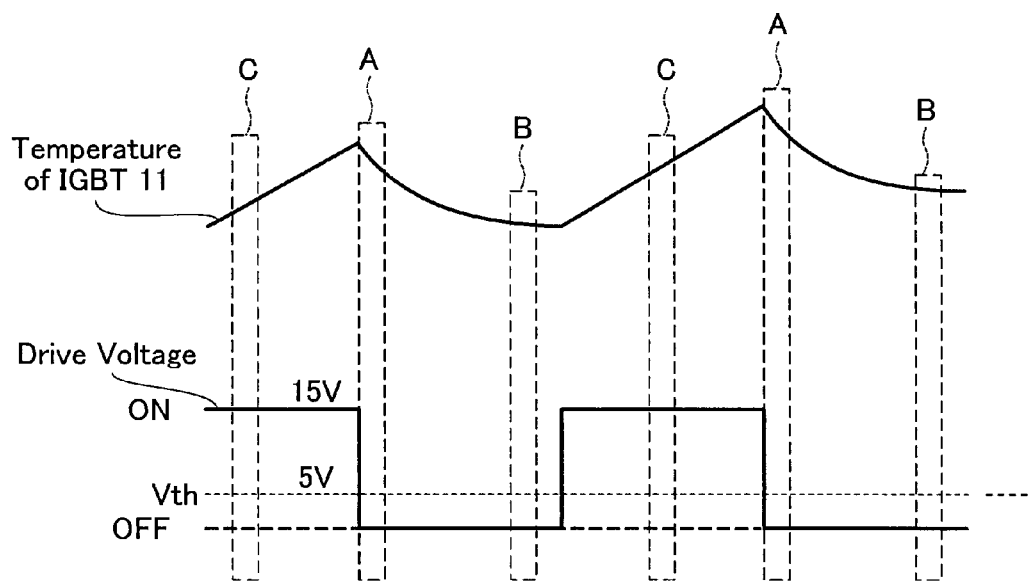
FIG. 3 shows a timing of detecting the temperature of the IGBT 11, and the drive voltage for the IGBT 11, by a voltage detection signal W, in the semiconductor device according to one embodiment of the present invention.

Referring next to FIG. 3, the timing of providing the voltage detection signal W (the timing of calculating the capacitance) is described. FIG. 3 shows the timing of detecting the temperature of the IGBT 11, and the drive voltage for the IGBT 11, by the voltage detection signal W.

As shown in FIG. 3, the drive voltage is controlled to keep 15 V or 0 V. If the IGBT 11 has a threshold voltage Vth of 5 V for on/off operation, and if the drive voltage is 15 V, which is higher than the threshold voltage Vth (5 V), then the gate of the IGBT 11 can be brought into the on-state. On the other hand, if the drive voltage is 0 V, which is lower than the threshold voltage Vth (5 V), then the gate of the IGBT 11 can be brought into the off-state. The temperature of the IGBT 11 rises in response to the gate-on of the IGBT 11 while the temperature of the IGBT 11 (the chip temperature) falls in response to the gate-off of the IGBT 11.

The detector 21 provides the voltage detection signal W at certain timings in the form of AC or pulses having a higher frequency than the switching frequency of the drive voltage for the IGBT 11. The controller 23 calculates the temperature of the IGBT 11 based on the voltage across the capacitor 211 measured at the detector 21. Desirably, the detector 21 provides the voltage detection signal W at a sufficiently lower voltage so as not to influence on operation of the IGBT 11. In particular, it may be configured to provide the voltage detection signal W at the timing when the gate of the IGBT 11 turns off. In such the case, the detector 21 is essentially required to provide the voltage detection signal W at a sufficiently lower voltage than the operating threshold voltage of the IGBT 11 so as not to turn on the gate of the IGBT 11.

As shown in FIG. 3 with the reference symbol A, the detector 21 may provide the voltage detection signal W immediately after the drive voltage falls from 15 V to 0 V (immediately after the IGBT 11 turns from the conduction state to the non-conduction state). In a word, the detector 21 may detect the voltage at the highest temperature of the IGBT 11. As shown in FIG. 3 with the reference symbol B, the detector 21 may provide the voltage detection signal W when the drive voltage is kept at 0 V and a certain time elapsed after the gate-off of the IGBT 11 (when a certain time elapsed after the IGBT 11 turns from the conduction state to the non-conduction state). In a word, the detector 21 may detect the voltage at the steady-state temperature of the IGBT 11. As shown in FIG. 3 with the reference symbol C, the detector 21 may provide the voltage detection signal W when the drive voltage is kept at 15 V (after the IGBT 11 turns from the non-conduction state to the conduction state). If the temperature of the IGBT 11 is measured at the timing shown in FIG. 3 with the reference symbol C, the controller 23 can control the signal applied to the gates of the transistors 221a, 221b based on the output signal from the detector 21 to control the temperature rise of the IGBT 11.

The above semiconductor device according to one embodiment makes it possible to detect the capacitance of the IGBT 11 through the gate electrode of the IGBT 11, thereby measuring the temperature of the IGBT 11 (semiconductor element). As a result, the semiconductor device of the present embodiment requires no temperature detector formed in the surface of the chip (semiconductor element) of the IGBT 11 as in the prior art. Therefore, the configuration of the same semiconductor device as above requires no process of forming a polysilicon diode as in the prior art and can reduce the area occupied by the semiconductor element. The configuration of the same semiconductor device as above also allows such processes as CMP (Chemical Mechanical Polishing) to be applied for much finer patterning of the semiconductor element. In addition, the surface of the semiconductor device can be planarized to improve the yield in mounting accordingly. Further, the simplified process steps together with the above effect make it possible to supply the semiconductor device at a lower cost. Additionally, the voltage detection signal W provided in the form of pulses makes it possible to detect the temperature with one pulse and accordingly suppress the power consumed in the temperature detection.

One embodiment of the present invention is described above though the present invention is not limited to the above embodiment. For example, the above embodiment is directed to controlling the temperature of the IGBT 11 though the present invention may be configured to control the temperatures of other semiconductor elements. In a word, the present invention is also applicable, in place of the IGBT 11 in the above embodiment, to a MOSFET, a bipolar transistor- or diode-contained MOSFET, a MCT (MOS Controlled Thyristor), and an EST (Emitter Controlled Thyristor).

What is claimed is:

1. A semiconductor device, comprising:
   a driver provided for a semiconductor element having a control electrode to which a drive voltage is applied, the semiconductor element being switched between a conduction state and a non-conduction state based on the drive voltage, the driver operative to apply the drive voltage to the control electrode;
   a detector operative to supply a voltage detection signal oscillating at a certain frequency to the control electrode to detect a first voltage having a certain relation to a voltage applied to the semiconductor element; and
   a controller operative to control the detector based on the first voltage detected at the detector.

2. The semiconductor device according to claim 1, the detector including
   a capacitor having one end connected to the semiconductor element, and
   an oscillator connected to the other end of the capacitor and operative to provide the voltage detection signal,
   wherein a voltage applied to the capacitor is detected as the first voltage.

3. The semiconductor device according to claim 1, wherein the controller controls the driver with the use of information on a relation between the first voltage and the temperature of the semiconductor element at the drive voltage.

4. The semiconductor device according to claim 1, wherein the detector oscillates the voltage detection signal in the form of alternate current or pulses.

5. The semiconductor device according to claim 1, wherein the detector oscillates the voltage detection signal at a higher frequency than the switching frequency of the drive voltage and a lower voltage than the threshold voltage of the semiconductor element.

6. The semiconductor device according to claim 1, wherein the detector provides the voltage detection signal immediately after the semiconductor element turns from a conduction state to a non-conduction state.

7. The semiconductor device according to claim 1, wherein the detector provides the voltage detection signal when a certain time elapsed after the semiconductor element turns from a conduction state to a non-conduction state.

8. The semiconductor device according to claim 1, wherein the detector provides the voltage detection signal after the semiconductor element turns from a non-conduction state to a conduction state.

9. The semiconductor device according to claim 1, wherein the semiconductor element comprises any one of an IGBT, a MOSFET, a MCT, and an EST.

10. The semiconductor device according to claim 2, wherein the controller controls the driver with the use of information on a relation between the first voltage and the temperature of the semiconductor element at the drive voltage.

11. The semiconductor device according to claim 2, wherein the detector oscillates the voltage detection signal in the form of alternate current or pulses.

12. The semiconductor device according to claim 2, wherein the detector oscillates the voltage detection signal at a higher frequency than the switching frequency of the drive voltage and a lower voltage than the threshold voltage of the semiconductor element.

13. The semiconductor device according to claim 3, wherein the detector oscillates the voltage detection signal in the form of alternate current or pulses.

14. The semiconductor device according to claim 3, wherein the detector oscillates the voltage detection signal at a higher frequency than the switching frequency of the drive voltage and a lower voltage than the threshold voltage of the semiconductor element.

15. The semiconductor device according to claim 4, wherein the detector oscillates the voltage detection signal at a higher frequency than the switching frequency of the drive voltage and a lower voltage than the threshold voltage of the semiconductor element.

* * * * *